United States Patent [19]

Levin

[11] 4,441,931
[45] Apr. 10, 1984

[54] METHOD OF MAKING SELF-ALIGNED GUARD REGIONS FOR SEMICONDUCTOR DEVICE ELEMENTS

[75] Inventor: Rafael M. Levin, Highland Park, N.J.

[73] Assignee: Bell Telephone Laboratories, Incorporated, Murray Hill, N.J.

[21] Appl. No.: 315,757

[22] Filed: Oct. 28, 1981

[51] Int. Cl.³ .................... H01L 21/28; H01L 21/265
[52] U.S. Cl. ...................................... 148/1.5; 29/571; 29/578; 29/591; 148/187; 357/15; 357/91
[58] Field of Search .................... 148/1.5, 187; 29/578, 29/591, 571; 357/15, 91

[56] References Cited

U.S. PATENT DOCUMENTS

| | | | |
|---|---|---|---|
| 3,920,861 | 11/1975 | Dean | 427/88 |
| 4,037,307 | 7/1977 | Smith | 29/571 |
| 4,108,717 | 8/1978 | Widman | 427/88 |
| 4,123,565 | 10/1978 | Sumitomo et al. | 427/88 |
| 4,145,459 | 3/1979 | Goel | 427/88 |
| 4,261,095 | 4/1981 | Dreves et al. | 29/571 |
| 4,282,539 | 8/1981 | Schrader | 357/23 |
| 4,337,115 | 6/1982 | Ikeda et al. | 427/88 |

OTHER PUBLICATIONS

Ning et al., IBM-TDB, 22 (1980), 4768.
Sato et al., J. Vac. Sci. Technol. 19, (1981), 1329.

*Primary Examiner*—Upendra Roy
*Attorney, Agent, or Firm*—David I. Caplan

[57] ABSTRACT

A method for forming a guard zone (21) is disclosed, suitable for a guard ring for a Schottky barrier diode or for a channel guard zone for protecting the channel inversion layer of an insulated gate field effect transistor. The method uses anisotropic (straight-line) etching of a window in a thermally grown silicon dioxide layer (2) on a silicon body (1) combined with deposition of a metallic masking layer (4, 14), such as aluminum, which is subject to a shadow effect of reduced thickness at a sidewall (25) of the window. Slight etching of the metallic masking layer results in an aperture at the resulting edges of the masking layer located in the vicinity of the sidewall of the thermally grown oxide layer. Ions are then implanted with the body through the aperture, to form the guard zone (21).

28 Claims, 4 Drawing Figures

METHOD OF MAKING SELF-ALIGNED GUARD REGIONS FOR SEMICONDUCTOR DEVICE ELEMENTS

BACKGROUND OF THE INVENTION

1. Field of the Invention

This invention relates to the field of semiconductor apparatus and, more particularly, self-aligned guard regions for semiconductor device elements.

2. Description of the Prior Art

A Schottky barrier diode is formed by a suitable metal contact to a semiconductor body. As is known, such a diode is a useful part of transistor logic circuits, particularly of the bipolar type, for increasing the speed of circuit operation. As is also known, a suitable impurity guard zone or ring surrounding the perimeter of the Schottky barrier is desirable to suppress unwanted diode edge effects. In modern VLSI (Very Large Scale Integrated) circuits, it would be desirable to make each such Schottky barrier diode together with its guard rings as small as possible in order to conserve precious semiconductor surface area.

Integrated circuit devices—such as bipolar transistors, as well as MOS (Metal Oxide Semiconductor) transistors—are conventionally defined by lithographic masking and etching steps, involving processing that requires selective exposure of a lithographic medium sensitive typically to electromagnetic or electron beam radiation. The minimum distance between opposed spaced apart sidewalls of an aperture defined and patterned by this method, the minimum process line-width, can be typically as little as about 2 microns in current technology. Thus, the smallest Schottky barrier diode made by such a typical process would have a diameter of 2 microns, exclusive of the guard ring. It can therefore be appreciated that if the guard ring would also be defined by further conventional lithography, then the overall lateral extent of the final Schottky barrier diode (including the guard ring) undesirably would be significantly larger than the 2 microns, and thus the speed of the diode would also be degraded because of the undesirably large area of the PN junction formed by the guard ring itself.

In the prior art, guard zones have been made for such semiconductor device elements as insulated gate field effect transistors and Schottky diodes. For example, in U.S. Pat. No. 4,282,539 entitled "Field Effect Transistor With Decreased Substrate Control of the Channel Width," issued to L. Schrader on Aug. 4, 1981, an insulated gate field effect transistor element is disclosed with a relatively narrow channel guard zone in the form of a strip (guard) region running along the outer edges of the transistor channel from source to drain. This guard zone or region is doped with impurities of such conductivity type and concentration as to inhibit the undesirable influence of the fluctuating potential between the source and the semiconductor body substrate on the effective width of the channel inversion layer during operation. Such fluctuating potential in the absence of this impurity doped guard region (or "zone") would cause unwanted fluctuations in the effective width of the channel inversion layer and hence unwanted fluctuations in the impedance of the transistor.

In U.S. Pat. No. 4,261,095 entitled "Self-Aligned Schottky Guard Ring," issued to R. F. Dreves et al. on Apr. 14, 1981, a Schottky barrier semiconductor diode element is described with a guard ring encircling the Schottky barrier for the purpose of suppressing undesirable barrier edge effects. The guard ring consists of an impurity doped zone at the surface of the semiconductor encircling the Schottky barrier thereat. This guard ring is described as being formed by introduction of impurities through an annular ring window (aperture). This ring in that patent is defined by space between edges of a circular window in an insulating layer on the surface of the semiconductor and the perimeter of a central area (within the circular window) on which has been deposited a metal layer by a straight-line shadow technique using an overhanging circular mask against deposition of the metal. The space between the perimeter of the central area and the edges of the circular window is thus defined by the overhang of the mask. A problem with the resulting Schottky barrier diode structure in that patent arises because portions of the surface of the semiconductor body underneath the overhang of the mask, located between a peripheral silicon dioxide passivation layer and the central Schottky barrier metallization layer, remain uncoated and exposed; so that the operational characteristics of the Schottky diode element tend to be degraded by residues of cleaning and etching solutions remaining on these portions of the surface, since such residues can undesirably attack the metallization, the oxide, or the semiconductor. Moreover, because of the use of an undercutting etching step, the overall area consumed by the diode element is undesirably increased. Also, ion implantation of the guard ring region cannot be used because of the device geometry, and therefore introduction of impurities by diffusion at undesirably high temperatures and with less control over the final guard ring zone profile must be used.

Thus, semiconductor device elements with self-aligned guard regions would be desirable which do not suffer from these shortcomings of the prior art.

SUMMARY OF THE INVENTION

This invention involves a method of defining a submicron feature (21) on a major planar surface of a semiconductor body (1) comprising the step of forming on said surface a patterned insulating layer (2) having a sidewall extending between first and second surfaces parallel to said major surface; characterized by the steps of depositing nonconformally a mask-forming metal layer (4, 14) onto said first and second surfaces, thereby inherently defining a relatively thin metal layer portion at the intersection of the sidewall with the first surface and a relatively thick metal layer portion at regions removed from said intersection; etching the metal to remove the relatively thin portion completely and to leave at least some of the metal at the relatively thick portion, whereby a submicron gap in the remaining metal layer (24, 34) is formed at said sidewall; and using the gap to define the feature (21).

In a specific embodiment of the invention, the semiconductor body is silicon, the patterned insulating layer is silicon dioxide, and the mask-forming layer is aluminum. After the patterned mask is formed, impurity ions are implanted into the body to form the guard zone, the mask is removed, an insulating spacer layer is formed on the sidewall of the insulating layer, and the Schottky barrier electrode is then formed. Metallization for interconnection of the resulting Schottky barrier diode to other device elements formed or to be formed at the major surface of the body is thereafter deposited and patterned in accordance with standard integrated circuit technology.

In another specific embodiment, a relatively thin silicon dioxide layer is plasma deposited on the patterned insulating layer of silicon dioxide which has been thermally grown on the silicon body. This plasma deposited silicon dioxide layer serves to intervene and protect the otherwise exposed portions of the silicon body from undesirable interactions with the mask-forming layer.

Accordingly, this invention provides a semiconductor device element with a guard zone at a major surface of a semiconductor body, the surface of said guard zone in common with said body consisting of first and second coated portions characterized in that all of said first portion is coated with an insulating layer having a sidewall which overlies, and is substantially perpendicular to, the surface of the guard zone, said insulating layer comprising first and second parts having a common mutual boundary which overlies, and is substantially perpendicular to, said surface of the guard zone.

The vertical sidewall of the insulating layer (i.e., a sidewall which is substantially perpendicular to the major surface of the semiconductor body) enables a smaller overall device element size than that obtained in the aforementioned U.S. Pat. No. 4,282,539 to Schrader, as will become clearer from the detailed description below.

BRIEF DESCRIPTION OF THE DRAWING

This invention may be better understood from the following detailed description when read in conjunction with the drawings in which.

Only for the sake of clarity, none of the drawings is to scale.

DETAILED DESCRIPTION

Figure 1:
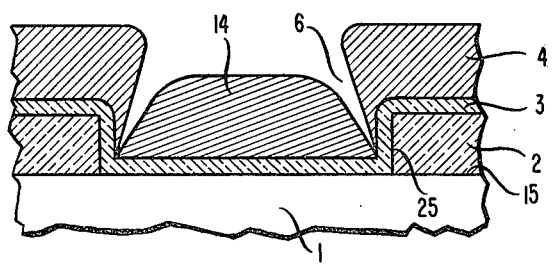
FIGS. 1-3 illustrate in cross section various stages of fabrication of a Schottky barrier device element with a guard zone, in accordance with a specific embodiment of the invention.

As shown in FIG. 1, the structure being fabricated includes a silicon semiconductor body 1 with a major planar surface 15 typically oriented (100). This surface is coated with a patterned silicon dioxide layer 2 having a steep sidewall 25. A plasma deposited silicon dioxide protective layer 3 covers the patterned layer 2 as well as those portions of the surface 15 which are not coated by the patterned layer. Aluminum is deposited by evaporation on the plasma deposited layer 3, such evaporation resulting in an outer aluminum layer portion 4 and an inner aluminum layer portion 14.

The deposition of aluminum by evaporation results in a nonuniform thickness of the aluminum because of the steep underlying sidewall 25 and because of the nonconformed properties of the deposition of aluminum by evaporation. The deposited aluminum thus forms as the separated (or nearly separated) portions 4 and 14, as illustrated in FIG. 1.

Typically, the silicon dioxide layer 2 is a thermally grown oxide, of thickness about 4,000 Angstroms patterned by standard lithographic processes with a window (or windows) whose edges overlie the guard zone (or zones) to be formed. In order to open such a window, a technique is used that results in anistropic etching of the layer 2; that is, a steep (vertical) sidewall 25 of the window is formed, that is, oriented substantially perpendicular to the surface 15. For this anistropic etching, for example, reactive ion etching can be employed, using such ions as "Freon 23" ($CHF_3$ and $NH_3$).

The plasma oxide layer 3 is deposited, typically to a thickness of about 1,000 Angstroms, by plasma enhanced chemical vapor deposition as described, for example, by A. C. Adams, et al., in a paper entitled "Characterization of Plasma-Deposited Silicon Dioxide," published in *Journal of the Electrochemical Society*, Vol. 128, pp. 1545-1551 (1981).

The aluminum for the layers 4 and 14 typically is deposited by evaporation at room temperature using a conical filamental source. A deep crack (or gap) 6 in the deposited aluminum forms in the immediate neighborhood of the sidewall 25 because of the well-known nonconformal step coverage resulting from such aluminum evaporation. This crack 6 thereby separates (or nearly separates) the deposited aluminum, into the outer portion 4 and the inner portion 14. The thickness of the deposited aluminum is typically about 6,000 Angstroms.

Figure 2:
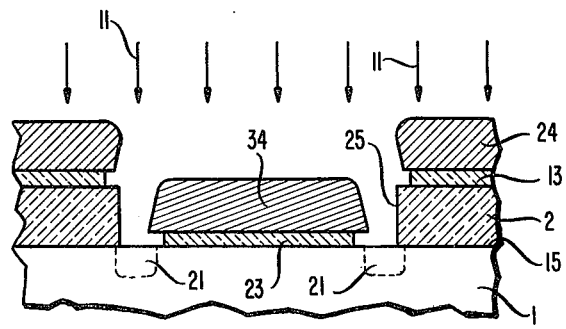

The crack 6 is then enlarged by an isotropic etching of aluminum, to form an etched outer layer 24 and an etched inner layer 34 as indicated in FIG. 2. Typically about a third of the previously deposited aluminum is thereby removed, for example, with an etching solution of about 16 moles phosphoric acid ($H_3PO_4$), 1 mole nitric acid ($HNO_3$), 1 mole acetic acid, and 2 moles water. Thus about 4,000 Angstrom thickness of aluminum remain in the resulting etched outer aluminum layer 24 and etched inner aluminum layer 34, which are thereby separated by a distance of about 2,000 Å.

Next, the plasma deposited oxide layer 3 is isotropically etched in order to expose portions of the major surface 15 of the body 1 underlying the immediate neighborhood of the separation between the etched inner and outer aluminum layers 34 and 24. Thereby separate outer and inner portions 13 and 23 of plasma deposited oxide remain. For this purpose, for example, an etching solution of equal volumes ethylene glycol and "BOE930" of Allied Chemical Company, which etches the plasma deposited silicon dioxide about 15 times faster than it etches thermally grown silicon dioxide and does not significantly etch aluminum or silicon.

Then boron ions 11 (FIG. 2) are implanted to form a guard zone 21. The inner and outer etched aluminum layers 34 and 24, and perhaps the small portion of thermally grown oxide layer 25 which may project out from under the edges of the outer aluminum layer 24 serve as a protective mask against the boron, so that the boron is implanted only in the guard zone 21. Typically, a dose of about 30 keV boron ions is thus implanted to a surface concentration of about $1 \times 10^{14}$ per square centimeter. The width of the implanted zone 21 (before subsequent activation and diffusion of the implanted ions) is typically about 3,000 Angstroms, i.e., considerably less than a micron (10,000 Angstroms).

Then the aluminum layers 24 and 34, as well as the plasma deposited oxide layers 13 and 23, are removed completely, as by etching with a solution of 1 mole hydrofluoric acid (HF), 100 mole water ($H_2O$) or first the above described solution used previously for enlarging the aluminum crack followed by the above described solution used for etching the plasma deposited oxide.

Figure 3:
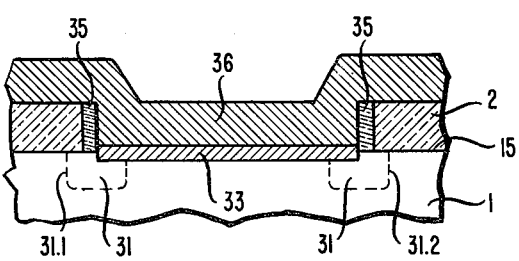

Next, about 1,500 Angstrom of silicon dioxide is deposited, as by chemical vapor deposition, and is anisotropically etched, as by unmasked reactive ion etching with Freon 23, to form a sidewall oxide layer 35 located on the sidewall of the thermally grown oxide layer 2 (FIG. 3). The purpose of this sidewall oxide layer 35 is to serve as a spacer to assure that the edge of a Schottky barrier electrode 33 to be formed is located centrally within the guard zone. An annealing, typically at about 900° C. for about 10 minutes, advantageously activates the implanted boron ions in the semiconductor and densifies the sidewall silicon dioxide layer 35.

Then the Schottky barrier electrode 33 is formed by a conventional process. Typically this electrode 33 is platinum silicide. Finally the resulting Schottky barrier device element is provided with metallization 36 (typically titanium, titanium nitride, platinum, gold) for interconnection to other device element(s) (not shown) located at the major surface 15.

The Schottky barrier electrode 33 is thus self-aligned with respect to the guard zone 31, by virtue of the method described above in which the only lithographic step was that used for patterning the oxide layer 2.

The use of the vertical sidewall, i.e., substantially perpendicular to the major surface 15, for the patterned insulating layer 2 thus enables a final device structure (FIG. 3) in which the distance between the outermost opposing edges 31.1 and 31.2, respectively, of the guard zone 31 is substantially no more than the lithographic distance previously used to define the aperture in the patterned insulating layer 2 (FIG. 1). This lithographic distance can be of minimum line-width extent for a minimum geometry diode device.

Although the invention has been described in detail with respect to a specific embodiment, various modifications can be made without departing from the scope of the invention. For example, the plasma deposited oxide layer 3 can be omitted in cases where the material used for the layer 14 does not undesirably react with the material of the underlying semiconductor body 1. Also, the sidewall oxide spacer layer 35 can be omitted in cases where centralization of the Schottky electrode 33 with respect to the guard zone 31 is not necessary. The semiconductor body 1 can be other than silicon, such as gallium arsenide.

Figure 4:
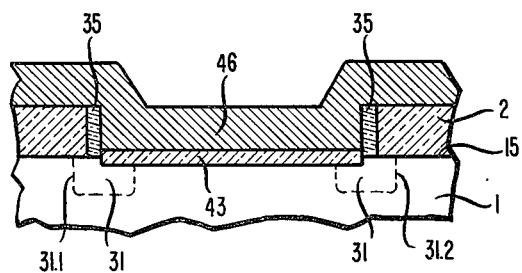
FIG. 4 is a cross section view of an insulated gate field effect transistor element, in accordance with another specific embodiment of the invention.

Finally, instead of the Schottky electrode 33, a gate oxide layer 43 (FIG. 4) can be thermally grown in order to utilize the guard zone 31 as a channel guard zone for the edges of a channel in an insulated gate field effect transistor structure with a polycrystalline silicon gate electrode layer 46.

What is claimed is:

1. A method of defining a submicron feature on a major planar surface of a semiconductor body comprising the step of
   forming on said surface a patterned insulating layer having a sidewall extending between first and second surfaces situated parallel to said major surface at differing first and second distances therefrom;
   depositing nonconformally a mask-forming metal layer onto said first and second surfaces, thereby inherently defining relatively thin metal layer portions at the intersection of the sidewall with the first surface and relatively thick first and second metal layer portions overlying the first and second surfaces, respectively, at regions removed from said intersection;
   etching the metal to remove the relatively thin portion completely and to leave at least some of both the first and second metal layers at the relatively thick portions, whereby a submicron gap in the remaining metal layer is formed at said sidewall; and
   using the gap to define the feature;
   (a) removing both said first and second metal layers simultaneously, and removing said protective layer to expose an underlying portion of the said major surface of the semiconductor body; and
   (b) forming an insulating spacer layer on the sidewall of the patterned layer.

2. The method of claim 1 in which said sidewall is perpendicular to said major planar surface.

3. The method of claim 1 or 2 further comprising the step of introducing impurity ions through the gap into underlying portions of the body.

4. The method of claim 3 in which a protective insulating layer is deposited on said patterned insulating layer prior to depositing said metal layer.

5. The method of claim 1 or 2 in which a protective insulating layer is deposited on said patterned insulating layer prior to depositing said metal layer.

6. The method of claim 5 in which said intersection is of minimum line-width extent.

7. The method of claim 1 or 2 in which the mask-forming metal is essentially aluminum.

8. The method of claim 3 further comprising the steps of:
   (a) removing both said first and second metal layers simultaneously, and then removing said protective layer to expose an underlying portion of the said major surface of the semiconductor body; and
   (b) forming an insulating spacer layer on the sidewall of the patterned layer.

9. The method of claim 5 in which the mask-forming metal is essentially aluminum.

10. The method of claim 5 in which the protective layer is plasma deposited silicon dioxide.

11. The method of claim 4 in which the protective layer is plasma deposited silicon dioxide.

12. The method of claim 8 further comprising the step of forming a Schottky barrier electrode at said exposed underlying portion of said major surface of the body.

13. The method of claim 4 further comprising the steps of:
   (a) simultaneously removing said first and second metal layers and then said protective layer to expose an underlying portion of the said major surface of the semiconductor body; and
   (b) forming an insulating spacer layer on the sidewall of the patterned layer.

14. The method of claim 13 in which said mask-forming metal is essentially aluminum.

15. The method of claim 14 in which said protective layer is essentially silicon dioxide.

16. The method of claim 15 in which said spacer layer is essentially silicon dioxide.

17. The method of claim 14 in which said spacer layer is essentially silicon dioxide.

18. A method for forming a guard zone for a guarded region at a major planar surface of a semiconductor body comprising the steps of:
   (a) forming an insulating layer on said surface within the complement of said guarded region, said insulating layer having an aperture characterized by a sidewall substantially perpendicular to said major surfaces;
   (b) depositing a masking layer of mask-forming material, said material being subject to a shadow effect by said sidewall, whereby the guarded region and the insulating layer are masked by first and second portions, respectively, of said masking layer, and the thickness of which masking layer is significantly reduced in a neighborhood of said sidewall as compared with the thickness thereof more removed from said sidewall;
(c) implanting impurities into the body at portions of the surface thereof in a neighborhood underlying said sidewall, to form said guard zone; and
(d) removing simultaneously said first and second portions of the masking layer.

19. The method of claim 18 including the added step of etching said mask-forming material to expose a portion of the surface of the body prior to implanting the impurities.

20. The method of claim 19 further including the step of depositing a protective layer prior to depositing said mask-forming material, in order for said protective layer to intervene between said major surface and said layer of mask-forming material.

21. The method of claim 18, 19, or 20 in which said layer of mask-forming material is etched to reduce its thickness.

22. The method of claim 21 in which said body is essentially silicon, and said insulating layer is essentially thermally grown silicon dioxide.

23. The method of claim 22 in which said mask-forming material is aluminum.

24. The method of claim 21 in which said mask-forming material is aluminum.

25. The method of claim 21 followed by the step of removing said protective layer from the guarded region of said major surface, to expose the underlying portion of the major surface of the body thereat.

26. The method of claim 25 followed by the step of forming a Schottky barrier electrode at said guarded region of the surface.

27. The method of claim 18, 19 or 20 followed by the step of depositing on said sidewall of the insulating layer a spacer layer of insulating material.

28. The method of claim 27 in which said spacer layer is silicon dioxide.

* * * * *